(12) United States Patent
Yoneda et al.

(10) Patent No.: US 7,847,480 B2
(45) Date of Patent: Dec. 7, 2010

(54) LIGHT EMITTING DIODE UNIT AND METHOD FOR MANUFACTURING LIGHT EMITTING DIODE UNIT

(75) Inventors: Kenji Yoneda, Kyoto (JP); Takahiro Amano, Sayo (JP); Yasuhiko Inagaki, Sayo (JP)

(73) Assignee: CCS, Inc., Kyoto (JP)

( * ) Notice: Subject to any disclaimer, the term of this patent is extended or adjusted under 35 U.S.C. 154(b) by 972 days.

(21) Appl. No.: 11/673,476

(22) Filed: Feb. 9, 2007

(65) Prior Publication Data

US 2007/0133211 A1 Jun. 14, 2007

Related U.S. Application Data

(62) Division of application No. 10/514,221, filed on Nov. 12, 2004, now Pat. No. 7,213,945.

(30) Foreign Application Priority Data

May 17, 2002 (JP) .......................... P2002-142788

(51) Int. Cl.
*H01J 1/62* (2006.01)
(52) U.S. Cl. ...................................... 313/512; 313/498
(58) Field of Classification Search .......... 313/498–512
See application file for complete search history.

(56) References Cited

U.S. PATENT DOCUMENTS

| 4,936,657 | A | 6/1990 | Tejima et al. |
| 5,485,317 | A | 1/1996 | Perissinotto et al. |
| 6,531,328 | B1 | 3/2003 | Chen |
| 2001/0022725 | A1 | 9/2001 | Kobayashi et al. |
| 2001/0030866 | A1 | 10/2001 | Hochstein |
| 2002/0105801 | A1 | 8/2002 | Martineau |
| 2002/0159270 | A1 | 10/2002 | Lynam et al. |
| 2003/0185005 | A1 | 10/2003 | Sommers et al. |

FOREIGN PATENT DOCUMENTS

| DE | 2209 194 | 8/1973 |
| DE | 36 24 188 | 2/1987 |
| DE | 195 42 416 | 5/1996 |
| DE | 196 19 478 | 11/1997 |
| DE | 201 15 813 | 3/2002 |
| EP | 1 235 281 | 8/2002 |
| EP | 1 434 277 | 6/2004 |
| GB | 2 343 548 | 5/2000 |
| JP | 49-82285 | 8/1974 |
| JP | 49-90066 | 8/1974 |

(Continued)

*Primary Examiner*—Joseph L Williams

(57) ABSTRACT

A light emitting diode unit comprises a light emitting element D1, a base 1 having a heat dissipating member 12 that dissipates heat generated by the light emitting element D1, and a first lens 2 comprising a reflecting element 214 that reflects light R2 traveling outside of a predetermined angle among the emitted light R emitted by the light emitting element D1 and a refracting element F that refracts light R1 traveling inside of the predetermined angle among the emitted light R each of which is formed integrally, with the first lens 2 mounted integrally on the base 1, and the emitted light R emitted from the light emitting element D1 is made to travel generally toward the same direction by the reflecting element 214 and the refracting element F.

19 Claims, 13 Drawing Sheets

FOREIGN PATENT DOCUMENTS

| | | |
|---|---|---|
| JP | 61-42002 | 3/1986 |
| JP | 61-147585 | 7/1986 |
| JP | 62-30363 | 2/1987 |
| JP | 62-160567 | 10/1987 |
| JP | 63-017585 | 1/1988 |
| JP | 5-13820 | 1/1993 |
| JP | 05-102528 | 4/1993 |
| JP | 5-77956 | 10/1993 |
| JP | 07-307492 | 11/1995 |
| JP | 11-298048 | 10/1999 |
| WO | WO 01/41222 | 6/2001 |

LIGHT EMITTING DIODE UNIT AND METHOD FOR MANUFACTURING LIGHT EMITTING DIODE UNIT

CROSS-REFERENCE TO RELATED APPLICATIONS

The present application is a divisional application of U.S. patent application Ser. No. 10/514,221 filed on Nov. 12, 2004, now U.S. Pat. No. 7,213,945.

FIELD OF THE ART

This invention relates to a light emitting diode unit used for inspection of appearance, finish or detection of flaws in a product.

BACKGROUND ART

Conventionally, for a light source of a light emitting diode type used in a light unit for inspection or the like, in order to improve the convergence performance, a bullet-shaped lens to converge the light emitted by a light emitting element is arranged, or a reflector that reflects the light near the light emitting element toward the direction of light emission is arranged near the light emitting element.

However, with light emitting diode units of the above-mentioned arrangement, since the irradiated light from the light emitting element reflects and travels inside the lens portion of the light emitting diode unit, or travels toward the direction of the light emission in a manner other than that would occur from a point source of light, the light emitted from the light emitting element can not be parallelized to travel toward a certain direction and the light can not be converged by, for example, a conventional converging lens, resulting in a problem that prevents a large amount of light from being irradiated upon a small area. In addition, there is a problem that some light irradiated from the light emitting element is irradiated in vain, such that laterally irradiated light is not utilized. Furthermore, although more light can be obtained from the light emitting element by increasing the amount of electric current, an undesirable release of heat energy is thereby increased drastically, causing rapidly deterioration of the light emitting element.

Then the present claimed invention mainly intends to solve the above-mentioned problems and to provide a high performance light emitting diode unit that can converge the light irradiated from the light emitting element without loss, and that can easily irradiate a large amount light upon a small area.

DISCLOSURE OF THE INVENTION

The present claimed invention is so arranged to comprise a light emitting element, a base having a heat dissipating member that dissipates heat generated by the light emitting element, and a first lens comprising a reflecting element that reflects light traveling outside of a predetermined angle among the light emitted by the light emitting element, and a refracting element that refracts light traveling inside of the predetermined angle among the light emitted by the light emitting element, each of which is formed integrally, with the first lens mounted integrally on the base, wherein the emitted light from the light emitting element is made to travel generally toward the same direction by the reflecting element and the refracting element.

In accordance with the arrangement, it is possible to converge the light irradiated from the light emitting element, a point light source, as parallel light rays traveling toward the same direction. In addition, if, for example, an aspherical lens or the like is used, the parallel light thus produced can be converged upon a small area, thereby enabling light emitting diode units of high performance that are ultimately superior in light converging performance, that can irradiate light of high intensity at the point of convergence. It is possible to incorporate with ease a light emitting diode unit thus arranged into equipment such as units for product inspection, and to enhance design freedom when doing so.

In addition, in order to protect the light emitting element without weakening the intensity of the light emitted from the light emitting element, and to effectively utilize the light from the light emitting element, it is required that internal reflection on a surface of the light emitting element be reduced. In order to do so, it is preferable that the first lens be provided with an element protective portion that accommodates the light emitting element, and that a transparent member of resin or the like, whose refractive index is between the refractive index of the first lens and the refractive index of the light emitting element, more preferably, whose refractive index is close to the refractive index of the first lens, fill the element protective portion.

Furthermore, in order to effectively converge light traveling inside the predetermined angle among the irradiated light, with a compact arrangement, it is preferable that the refracting element be a Fresnel lens comprising a convex lens portion arranged at the lens center and multiple orbicular zone lens portions arranged concentrically around the convex lens portion.

If light emitted from the light emitting element is attempted to be parallelized by an ordinary spherical refracting lens or an aspherical refracting lens, the light intensity increases away from the center of the beam, as shown in FIG. 13. Furthermore, in cases where the light is converged again in order to introduce parallel light into an object X, for example to introduce light into an optical fiber or a rod lens, the angle between the outside portion of the light and the center of the optical axis LC increases with distance away form the center, which prevents the efficient introduction of light into the object X or the efficient transmission of light inside the object X. As a result, as shown in FIG. 13, parallel light H whose light intensity is higher at a position further from the center of the light is deleterious from the standpoint of the efficient introduction of light into an optical fiber or a rod lens.

In order to solve this problem and to obtain parallel light whose intensity is essentially uniform, the distance between each orbicular zone lens portion and the plane of the light emitting element, parallel to the optical axis, must increase for orbicular zone lens portions located closer to the center. "The distance between each orbicular zone lens portion and the plane of the light emitting element, parallel to the optical axis" is the distance between, for example, the center of the refracting surface of an orbicular zone lens portion and the plane of the light emitting element, along a direction of the optical axis.

More preferably, the refracting surface of each orbicular zone lens portion is made to be aspherical.

The light emitting element functions almost as a point light source, however, in actuality it is a surface light source having a measurable light emitting area. In order to refract all of the light emitted from the light emitting element by means of the refracting surfaces of the orbicular zone lens portions and to irradiate it forward without appreciable loss, it is preferable that the angle, between a connecting surface between the refracting surface of one orbicular zone lens portion and the refracting surface of the orbicular zone lens portion of its outer radial neighbor and the optical axis, be set to be identical with or smaller than the angle between the light traveling from the end of the light emitting element toward the bottom end of the connecting surface and the optical axis.

In order to emit high luminance light, a large current must be passed through the light emitting element, a point light source, and in order to mitigate the problem of heat generated by the light emitting element, the base is preferably so arranged that a heat conductive member whose coefficient of heat conductivity is larger than that of the heat dissipating member is arranged between the heat dissipating member and the light emitting element.

In order to reduce the number of components surrounding the light emitting element and to enable easy assembly, it is preferable that the base further comprise a wiring board mounted on a surface of the heat dissipating member and that a wire which supplies electric power to the light emitting element be directly connected to the wiring board.

Furthermore, in order to introduce light into an optical fiber or rod lens, as mentioned above, it is preferable that a second lens that converges the light emitted by the light emitting unit be mounted on the first lens.

For a light emitting element D1 of a super high luminance type (referred to as a power LED) that can pass a current of not less than 250 mA, an arrangement is known, as shown in FIG. 10, in which the boundary between the P-layer and the N-layer is extremely close (several μm) to a connecting surface of the wiring pattern C, in consideration of heat dissipation. In this case, where such a light emitting element D1 is arranged on a base 1 comprising a heat dissipating member 12, a laminated insulating material 15 covering the heat dissipating member 12, and a wiring pattern C arranged on the insulating material 15, if a connecting surface of the light emitting element D1 is directly soldered to the wiring pattern C, the P-layer and the N-layer of the light emitting element D1 might be electrically connected by the solder protruding around the light emitting element D1, and thus might be short-circuited even though the insulating material 15 is undamaged, because the melting point of the solder is comparatively low. In order to avoid this, if the wiring pattern C and the light emitting element D1 are connected using an alloy of gold and tin, the insulating material 15 might be damaged due to the high temperature required to melt the alloy when the parts are bonded together, even though the problem of protruding metal around the light emitting element D1 is prevented.

These problems surfaced with the advent of the so-called power LED and in order to eliminate them permanently it is preferable that the light emitting element be mounted on the wiring pattern via a spacer having a predetermined thickness. This is because it is then possible to prevent the insulating material from being breached, as it might be if the spacer and wiring pattern were connected with solder whose melting temperature is low, and it is possible to thereby prevent the light emitting element from being short-circuited by connecting the spacer and light emitting element using an alloy of gold and tin whose propensity to protrude from the joint is low.

In accordance with this arrangement, the following effects can also be produced.

More specifically, in case of bonding the light emitting element with a spacer made of, for example, copper whose heat capacity is less than that of the base and whose thermal conductivity is far superior, it requires less time to apply heat than in a case where the light emitting element is bonded with a base whose heat capacity is larger than that of the spacer, thereby to lessen the possibility of deterioration of or damage to the light emitting element due to the heat of the bonding process. In conjunction with this, if the spacer is made of a material such as copper that is superior in terms of heat conduction, it is also possible to lessen the possibility of damage to the light emitting element due to heat during use, when light is emitted.

In addition, if a necessity arises to bend the base, the force causing the base to bend will not be directly transmitted to the light emitting element, preventing the possibility of damage to the light emitting element or its becoming detached due to such force and movement.

Furthermore, since the light emitting element protrudes from the base by the height of the spacer, an optical system can be mounted with ease, which, through reflection, can facilitate the effective utilization of light irradiated exactly radially from the light emitting element.

In addition, since with conventional arrangements the portion connecting the light emitting element is a wiring pattern, the entire surface of the wiring pattern must be extremely smooth. However, in accordance with the arrangement of the present claimed invention, a predetermined degree of smoothness is required only for the top surface of the spacer, thereby simplifying the manufacturing process.

The temperature of the light emitting element, the base and the spacer all fluctuate when bonding is carried out or during light emission, and each of the parts expands or contracts individually, as the temperature varies. Then if the thermal expansion coefficient of each material differs widely, stress will be generated where the parts are connected, due to temperature fluctuations, which might cause loose connections or failure of the device. In order to prevent this and to mitigate thermal stress by means of the spacer, it is preferable that the thermal expansion coefficient of the spacer have a value between the thermal expansion coefficient of the light emitting element and the thermal expansion coefficient of the heat dissipating member.

More concretely, it is preferable that the base be made of aluminum and that the spacer be made of electrically conductive material, for example, copper. As mentioned above, since the copper has superior thermal conductivity, the heat generated from the light emitting element will be quickly transmitted to the base and the temperature difference between the light emitting element, the spacer and the base can be equalized in a short period of time, and the thermal stress resulting from temperature differences between the light emitting element, the spacer and the base, can also be suppressed. In addition, since copper is electrically conductive, a portion of the wiring can be omitted.

To have a spacer that is more preferable in terms of protecting the light emitting element from thermal stress, it is suggested that the thermal expansion coefficient of the spacer have a value between the thermal expansion coefficient of the light emitting element and the thermal expansion coefficient of the heat dissipating member, and that the value be closer to the thermal expansion coefficient of the light emitting element than the thermal expansion coefficient of the heat dissipating member.

Since the light emitting element is extremely small and difficult to handle, very complicated and expensive equipment is required in order to mount it with conventional methods for mounting a light emitting element on a base directly, different costly equipment is required every time light emitting elements are to be mounted on a base of a different design, and similarly, if multiple light emitting elements are to be mounted, a different and costly piece of equipment would be required. In addition, since such light emitting elements are directly handled, they may suffer damage. Furthermore, if a damaged light emitting element is mistakenly mounted on a base by a method that does not allow the light emitting element to be dismounted, such when an alloy of gold and tin is used, such a base mounted with a damaged light emitting element would have to be discarded.

In accordance with a method for manufacturing the light emitting diode unit that includes a process wherein the spacer is mounted on the base after the light emitting element is mounted on the spacer, since the process of mounting the light emitting element on the spacer can be carried out with common equipment, the equipment can be simplified. In addition, it is possible to avoid a situation where the entire base has to be discarded due to a defective light emitting element or a light emitting element whose bonding or wiring to the spacer failed, because such defective parts can be discarded at the time the light emitting element is mounted on the spacer. In addition, if a spacer is improperly connected to the base (positional inaccuracy) the spacer can be simply dismounted and remounted appropriately because it is connected by soldering.

Furthermore, since it is possible to mount the light emitting element on the base without touching the light emitting element, because the spacer itself is grasped and mounted, the problem of light emitting elements being broken when mounted on the base can be avoided, thereby improving production yields.

BEST MODES OF EMBODYING THE INVENTION

An embodiment of the present claimed invention will be explained with reference to FIG. 1 through FIG. 4.

Figure 1:
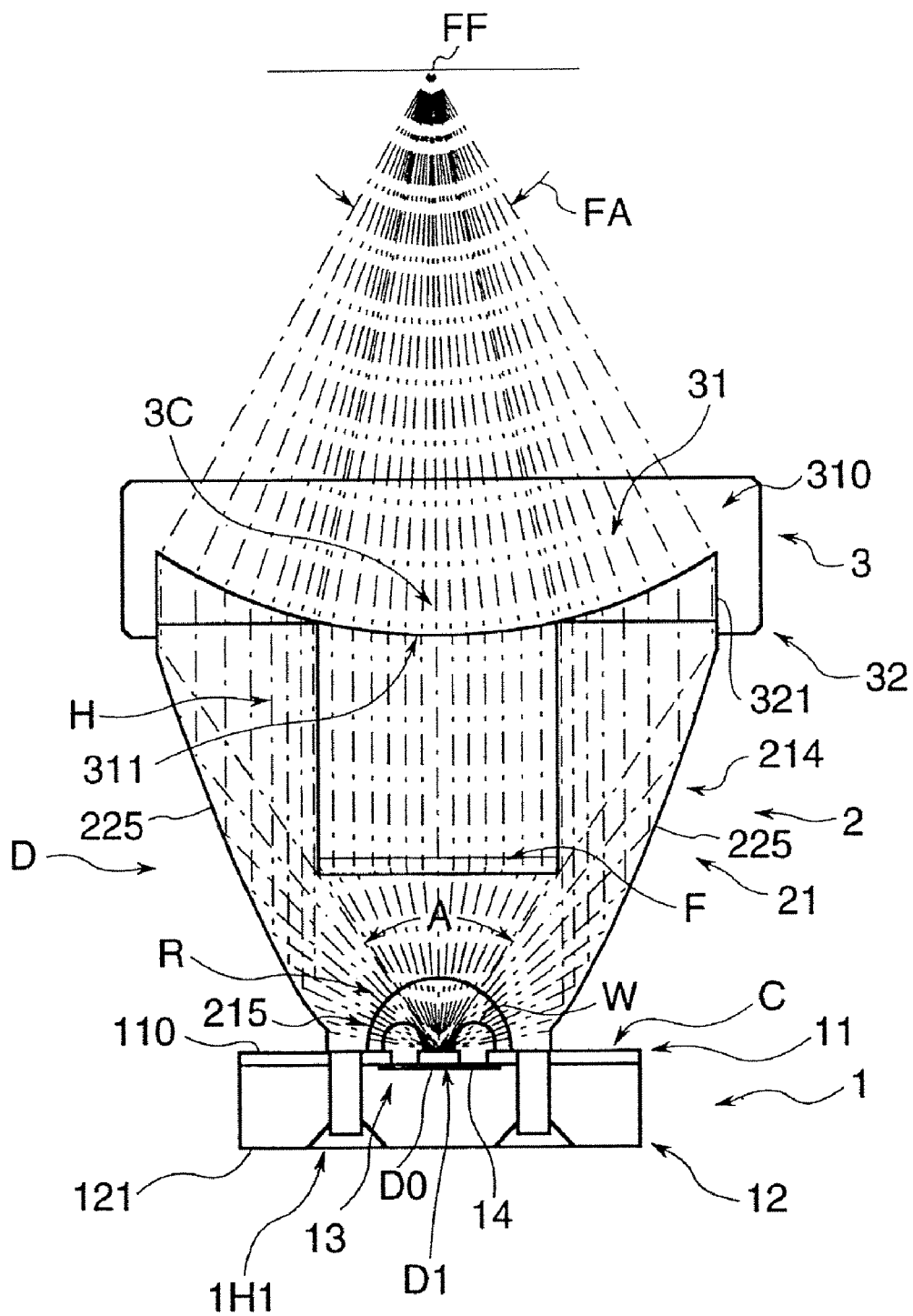
FIG. 1 is a general structure cross-sectional view of a light emitting diode unit constituting a system in accordance with an embodiment of the present claimed invention.

FIG. 1 is a general structure cross-sectional view of a light emitting diode unit D constituting a system in accordance with an embodiment of the present claimed invention.

The light emitting diode unit D comprises a bear element D1 as being a light emitting element to be utilized for, for example, a power LED, a base 1 in a predetermined area of which the bear element D1 is arranged, a first lens 2 that is supported by the base 1 and that transfers emitted light R emitted by the bear element D1 into generally parallel light H traveling toward a desired traveling direction as being a radiation axis P, and a second lens 3 arranged to contact along a distal end portion 220 of the first lens 2.

In this embodiment, a traveling axis of the parallel light H of the first lens 2 is set as "a radiation axis" and a direction that the light emitting element D1 emits the emitted light R is defined as "a direction of light emission" and its opposite direction as "an opposite direction of the light emission".

Each component will be described in detail.

Figure 2:
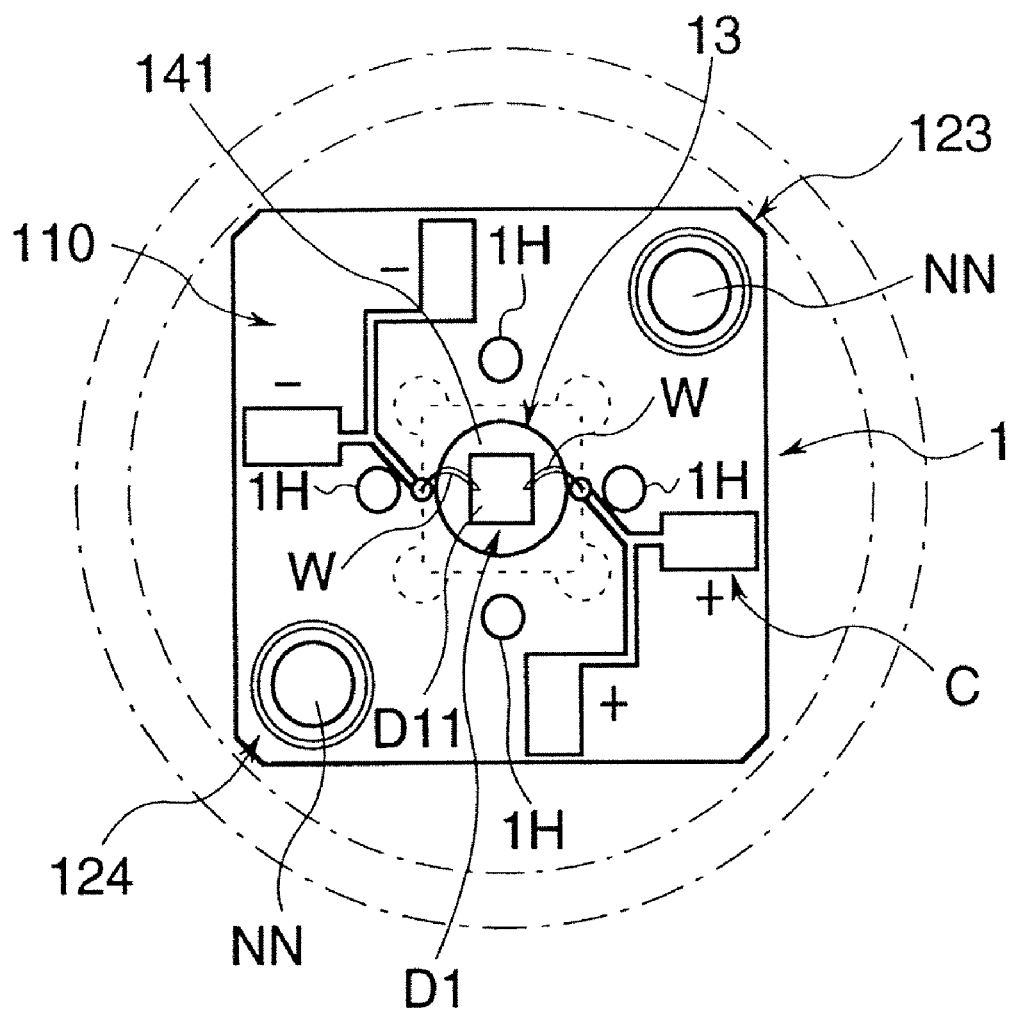
FIG. 2 is a plane view of a base in accordance with the embodiment.
Figure 3:
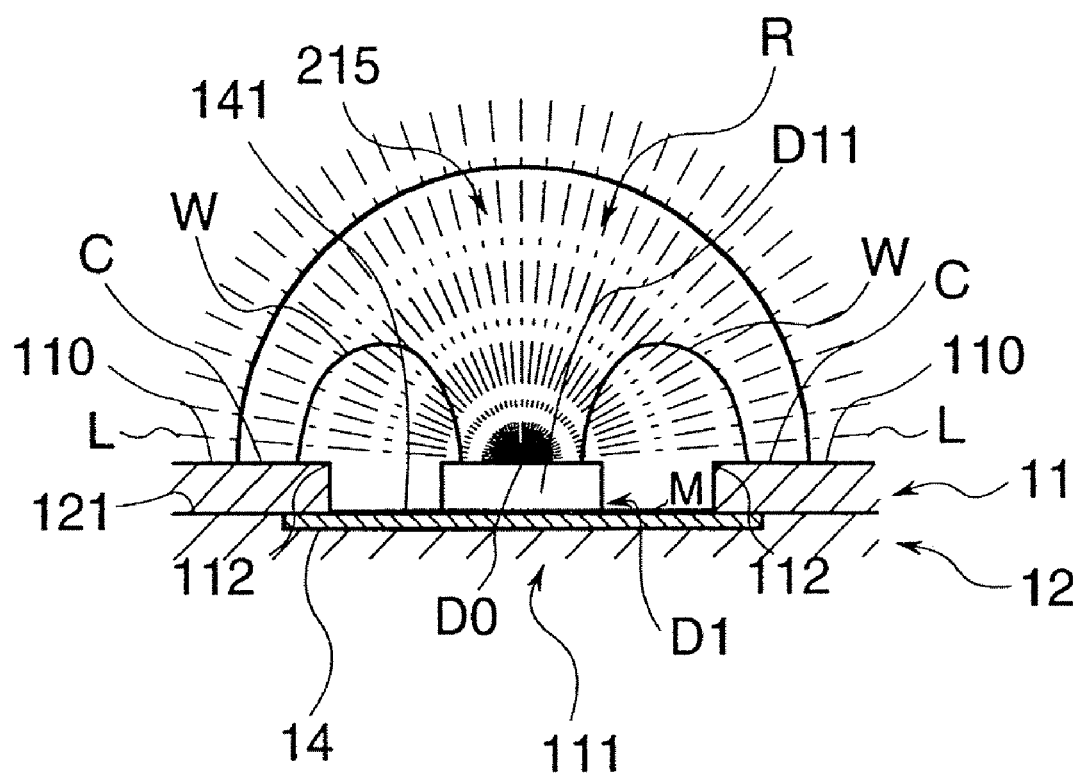
FIG. 3 is a magnified longitudinal sectional view showing a portion where a bear element is mounted in accordance with the embodiment.

The bear element D1 is, as shown in FIG. 1 through FIG. 3, of a surface-mounted type having a light emitting surface D11 that radiates a predetermined color from its surface. Since the bear element D1 is in an extremely small rectangle shape in a plane view of about 1-mm-square, it can be regarded as a point light source.

The base 1 is a generally rectangle shape in a plane view, as shown in FIG. 1 through FIG. 3, wherein a heat conductive member 14 that receives heat generated by the bear element D1 directly, a heat dissipating member 12 that dissipates the heat received by the heat conductive member 14, and a wiring board 11 that is to supply electric power to the bear element D1 are arranged hierarchically along a direction of thickness. Each member is mounted in layers, namely the heat dissipating member 12, the heat conductive member 14 and the wiring board 11 are bonded in sequence from the opposite direction of the light emission by an adhesive agent of high thermal conductivity, elastomer such as silicon, or resin.

More concretely, the heat conductive member 14 is in a rectangle shape of a thin plate wherein a bear element mounting surface 141 to which the bear element D1 can be directly bonded is arranged at a center portion of its surface, and contacts with all of the back surface of the light emitting surface D11 of the bear element D1. The heat conductive member 14 is so formed to have a larger area than an area of the bear element D1. The heat conductive member 14 is made of a material having high thermal conductivity such as synthetic diamond, aluminum nitride, heat dissipating molten resin, or liquid ceramics so that the heat generated by the bear element D1 can be transmitted to the heat dissipating member 12 with rapid diffusion toward its surface. Furthermore, silver plate coating M whose reflection coefficient is large so that each wavelength of a visible light region can be effectively reflected is applied to the surface of the heat conductive member 14 by an ion plating method so that a formed coated layer can obtain superior characteristics in terms of corrosion resistance.

The heat dissipating member 12 is in a generally rectangle shape made of a heat dissipating metal such as copper or aluminum that can effectively dissipate the heat generated by the bear element D1.

The wiring board 11 is in a shape of a thin plate with a thickness almost the same as a thickness of the bear element D1 and its outer shape generally the same as that of the heat dissipating member 12 and mounted on the heat dissipating member 12. A wiring pattern C is formed on its surface 110 to be able to supply electric power from outside of the light emitting diode unit D. Furthermore, the heat dissipating member 12 is provided with a concave, with which the heat conductive member 14 is bonded, so that a surface of the heat conductive member 14 is made to be generally flat to a surface of the heat dissipating member 12, and the bear element D1 arranged on the surface of the heat conductive member 14 is exposed through a cylindrical bear element exposing bore 111 that has a diameter smaller than a side of the heat conductive member 14 arranged at a position of the wiring board 11 overlapping with the bear element D1. Then the light emitting surface D11 of the bear element D1 is set at a position generally flat to the surface 110 of the wiring board 11.

In addition, the wiring pattern C and the bear element D1 are directly connected via a wire W in a manner that electricity can be conducted and the bear element D1 emits light when electric power is supplied to the wiring pattern C.

In this embodiment, screw holes NN are formed at corner portions 123, 124 of the base 1 and the base 1 can be screwed on a body or the like of an inspection unit, not shown in drawings, by making use of the screw holes NN.

Figure 4:
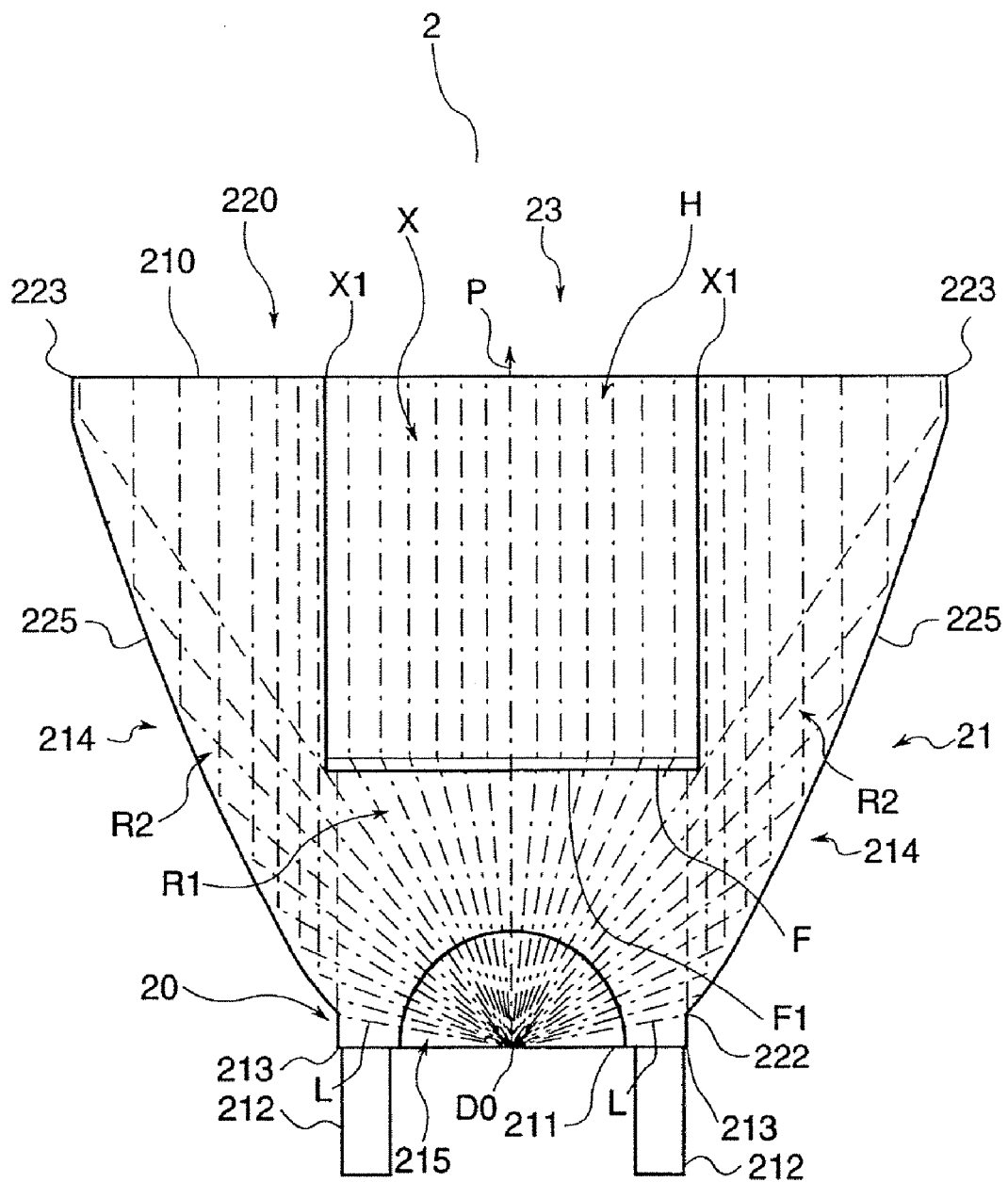
FIG. 4 is a longitudinal sectional view showing a first lens in accordance with the embodiment.

The first lens 2 comprises, as shown in FIG. 1 and FIG. 4, a lens principal element portion 21 that is formed generally in a horn shape and whose distal end face is a large diameter portion, and a projecting portion 212 that projects from a proximal end face 211 of the lens principal element portion 21 toward the opposite direction of the light emission and each of the lens principal element portion 21 and the projecting portion 212 is integrally formed. In addition, in a state that the first lens 2 and the base 1 are integrally assembled, the proximal end face 211 is set to make an abutting contact with the surface 110 of the wiring board 11 of the base 1, and the proximal end face 211 and the light emitting surface D11 of the bear element D1 are generally at the same height.

Each component will be described in detail.

The lens principal element portion 21 forms a Fresnel lens F as being a refracting element at a bottom surface F1 of a concave portion X of a generally column shape arranged to be dented at a center portion of a distal end face 210, and a reflecting element 214 expressed by a parabolic line ranging generally over the whole area extending from a circumferential end edge 213 of the proximal end face 211 to a circumferential end edge 223 of the distal end face 210.

More concretely, a refractive index of the Fresnel lens F is so set that Fresnel incident light R1 traveling inside of an incident angle A and incoming to the Fresnel lens F among the emitted light R emitted from the bear element D1 is refracted so as to be parallel to the radiation axis P and to travel toward the distal end portion 220 of the first lens 2. In this embodiment, the Fresnel lens F is integrally formed with the lens principal element portion 21, however, it is not limited to this and the Fresnel lens F may be separately formed from the lens principal element portion 21.

The reflecting element 214 forms a reflection wall 225 that is arranged between a proximal end 222 located at a side of the base 1 relative to a light path L radiated to the most side direction among the emitted light R emitted from the bear element D1 and the circumferential end edge 223 of the distal end face 210 of the lens principal element portion 21. The reflection wall 225 is formed to be a predetermined shape so that Fresnel non-incident light R2 traveling outside of the incident angle A and incoming to the Fresnel lens F as being the emitted light other than the Fresnel incident light R1 among the emitted light R emitted from the bear element D1 can be reflected to travel toward the distal end portion 220 of the first lens 2. In this embodiment, almost entire area of the predetermined shape is made to be a parabolic shape wherein the Fresnel non-incident light R2 can travel toward a direction of the above-mentioned parallel light H, however, it is not limited to this as far as the Fresnel non-incident light R2 travels toward the direction of the parallel light H, and may be a shape expressed by, for example, an exponential function.

The projecting portion 212 is in a column shape and four projecting portions 212 are arranged at even intervals along inside of the circumferential end edge 213 of the proximal end face 211. Each of the four projecting portions 212 is inserted into a through bore 1H for mounting the lens on the base 1 respectively and then molten and cured by providing thermal caulking with a soldering iron or the like so that the first lens 2 and the base 1 are mounted integrally. A method for mounting the first lens 2 on the base 1 is not limited to this embodiment, and may utilize a screw.

Furthermore, an element protecting portion 215 is formed at the proximal end portion 20 of the lens principal element portion 21 to be dented in a shape of a hemisphere from the proximal end face 211 toward the direction of the light emission. A material having heat-resistance and transparency such as silicon or epoxy resin fills the element protecting portion 215 so as to cover and protect the bear element D1 and the wire W.

The second lens 3 comprises, as shown in FIG. 1, an aspherical lens portion 31 whose center portion 3C is formed to bulge toward the opposite direction of the light emission and a cylindrical lens holding portion 32 arranged to extend from a circumferential end edge 310 of the aspherical lens portion 31. The second lens 3 is so arranged that a lens surface 311 of the aspherical lens portion 31 contacts along an aperture X1 of the concave portion X of the first lens 2 and an inside surface 321 of the lens holding portion 32 fits over the circumferential end edge 223 of the distal end face 210 of the first lens 2. A curvature of the aspherical lens portion 31 is, as shown in FIG. 1, so set that the second lens 3 arranged to contact along the first lens 2 converges the parallel light H traveling from the first lens 2 upon a point of convergence FF at an angle of convergence FA. The angle of convergence FA can be set arbitrary other than that of this embodiment by changing the curvature of the aspherical lens portion 31.

Next, an operation of the light emitting diode unit D having the above arrangement in accordance with the present claimed invention will be explained.

First, when electric power is supplied to the wiring pattern C, the bear element D1 to which the electric power is supplied emits the emitted light R. The Fresnel incident light R1 incoming into the Fresnel lens F among the emitted light R is made to be the parallel light H parallel to the radiation axis P by being refracted by the Fresnel lens F and travels toward the distal end portion 220 of the first lens 2. Meanwhile, the Fresnel non-incident light R2 that does not income into the Fresnel lens F among the emitted light R is made to be the parallel light H parallel to the radiation axis P by being reflected by the reflection wall 225 and travels toward the distal end portion 220 of the first lens 2.

As mentioned above, the emitted light R emitted from the bare element D1, the point light source, reaches the distal end portion 220 of the first lens 2 as being the parallel light H by the Fresnel lens F and the reflection wall 225.

The parallel light H that reaches the distal end portion 220 of the first lens 2 is converged upon the point of convergence FF by the aspherical lens 31 of the second lens 3, thereby obtaining a large amount of light at the point of convergence FF of a small area.

When the bear element D1 emits the emitted light R, the bear element D1 generates heat. The heat generated by the bear element D1 is immediately diffused by the heat conducting member 14 that contacts the bear element D1 and transmitted to the heat dissipating member 12, and then released by the heat dissipating member 12. As mentioned, since the heat generated by the bear element D1 can be released effectively, it is possible to prevent deterioration of light emitting performance or shortening a life due to temperature rise, and to pass a big electric current as well.

As mentioned above, in accordance with the present claimed invention, it is possible to converge the emitted light R emitted from the bear element D1, the point light source, as the parallel light rays traveling toward the same direction without loss. In addition, if, for example, an aspherical lens or the like is used, the parallel light thus produced can be converged upon a small area with ease, thereby enabling light emitting diode units of high performance that are ultimately superior in light converging performance, and that can irradiate light of high intensity at the point of convergence.

In addition, since the heat generated by the light emitting element can be effectively released, it is possible to prevent deterioration of light emitting performance of the light emitting element or shortening a life of the light emitting element.

Furthermore, since a portion to converge light such as a lens and the base are integrally formed and an angle of convergence can be set arbitrary by exchanging the second lens, design freedom can be enhanced such that the light emitting diode unit can be incorporated into various equipment and the light emitting diode unit can be very preferably used as a light source for, for example, a product inspection that requires a dose examination such as a wiring check or a flaw check for each product.

In addition, it is possible to provide a light emitting diode unit wherein the light emitting element can be protected without weakening an intensity of the light emitted from the light emitting element, a number of components surrounding the light emitting element can be reduced because the wire W to supply the electric power to the light emitting element is directly connected to the wiring pattern C, and a process to connect the light emitting element and the wiring pattern C, both of which are arranged in generally the same plane, with a wire can be extremely simplified.

In the above embodiment, the Fresnel lens is used as the refracting element F, however, other lens may be used as far as the incident light R1 incoming from the bear element D1 is refracted so as to be emitted as the parallel light H. Other lens may be, for example, an aspheric lens or the like.

In addition, since the emitted light that travels outside of the light path L among the emitted light R emitted from the light emitting diode D1 and that has not been used can be reflected by the reflection wall 225 so as to travel toward the distal end portion 220 of the first lens 2 if the proximal end 222 is moved to the opposite direction of the light emission, it is possible to further improve light converging characteristics of the light emitting diode unit.

Furthermore, the aspherical lens portion 31 is used as the second lens 3, however, it is not limited to this as far as the angle of convergence may be set arbitrary such as the Fresnel lens or the like. Since the light converged at the arbitrary angle of convergence by the second lens can be made to enter an optical fiber and utilized as the light having the same angle as that of the light incoming from its opposite direction, the following embodiment may be conceived; the light converged upon the point of convergence FF at the arbitrary angle of convergence is introduced to a separate position through the optical fiber and irradiated at an emitting angle having the same angle as the angle of convergence. In addition, if thus arranged optical fiber is mounted on multiple light emitting diode units, an increasing light intensity can be obtained.

A single combination of the bear element D1 and the first lens 2 is arranged on the base 1 in the above embodiment, however, it is not limited to this and multiple combinations of the bear element D1 and the first lens 2 may be arranged on the base 1.

Figure 5:
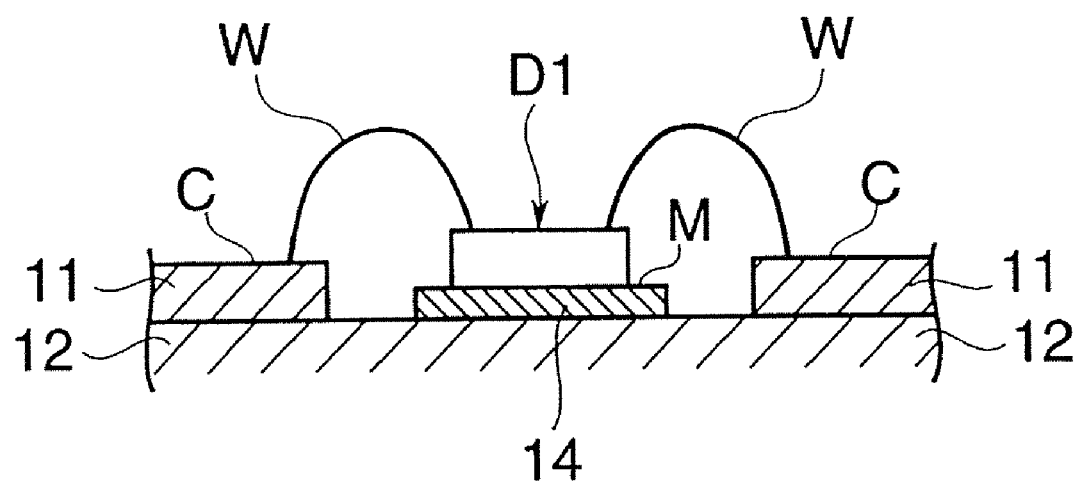
FIG. 5 is a magnified longitudinal sectional view showing a portion where a bear element is mounted in accordance with another embodiment of the present claimed invention.
Figure 6:
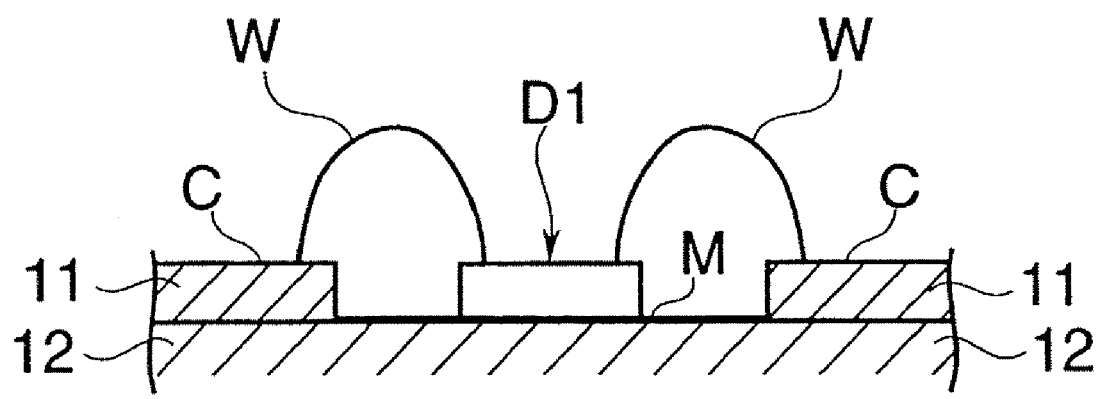
FIG. 6 is a magnified longitudinal sectional view showing a portion where a bear element is mounted in accordance with a further different embodiment of the present claimed invention.
Figure 7:
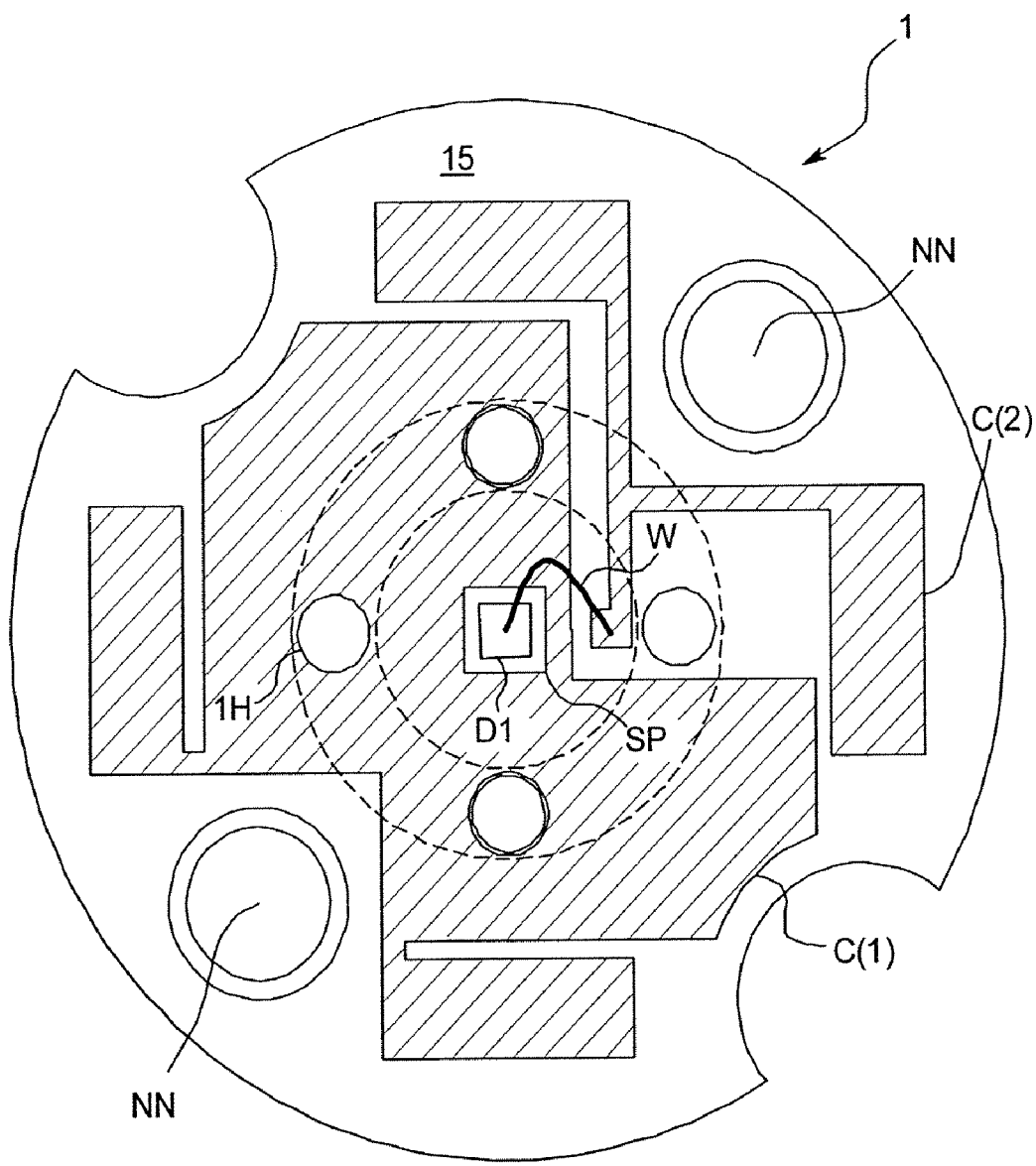
FIG. 7 is a plane view of a base in accordance with a further different embodiment of the present claimed invention.
Figure 8:
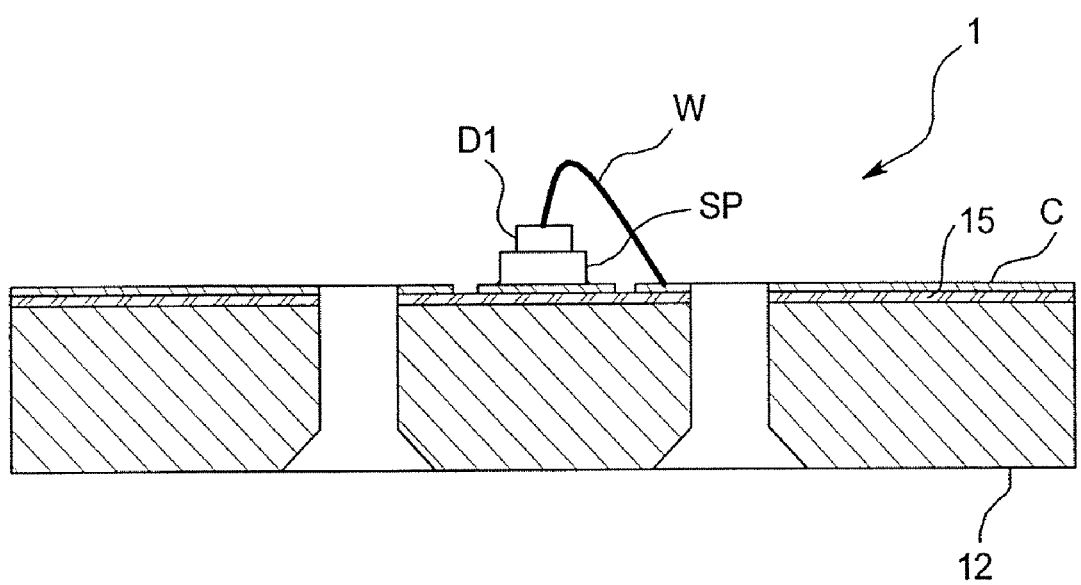
FIG. 8 is a longitudinal sectional view of the base in accordance with the embodiment.
Figure 9:
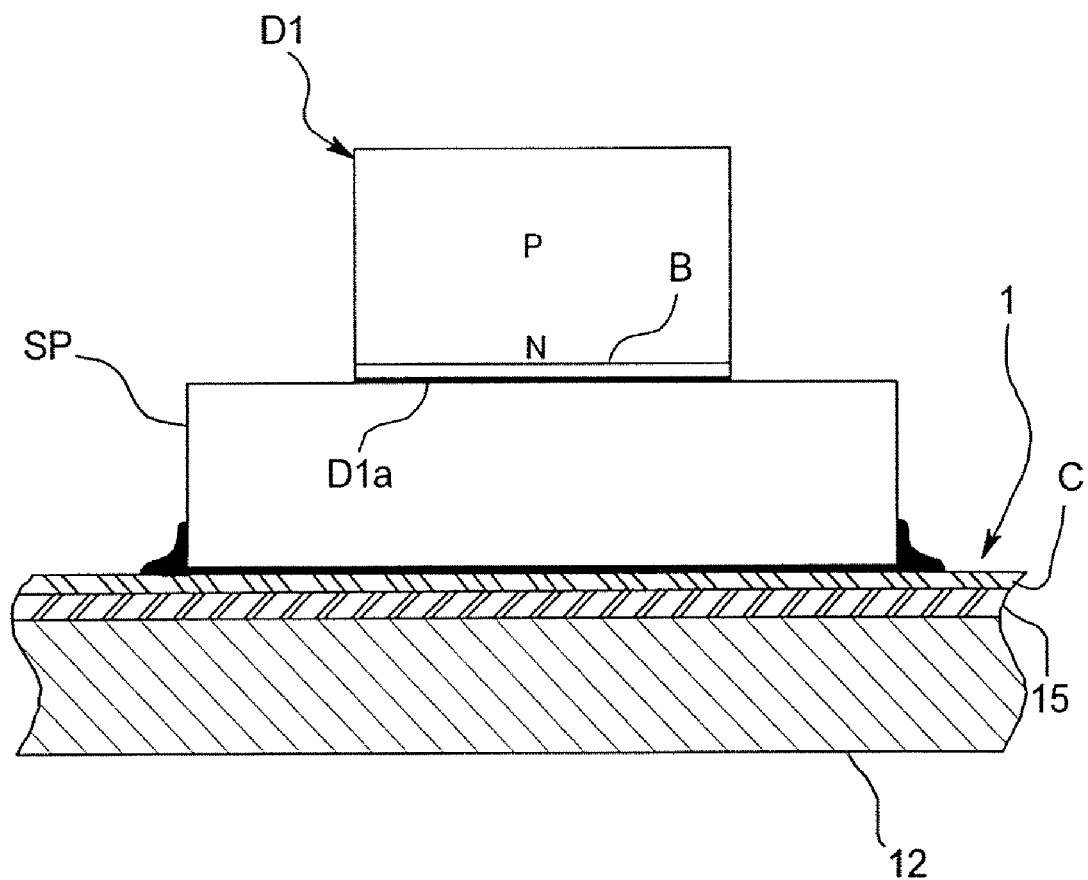
FIG. 9 is a magnified longitudinal sectional view showing a portion where a bear element is mounted in accordance with the embodiment.
Figure 10:
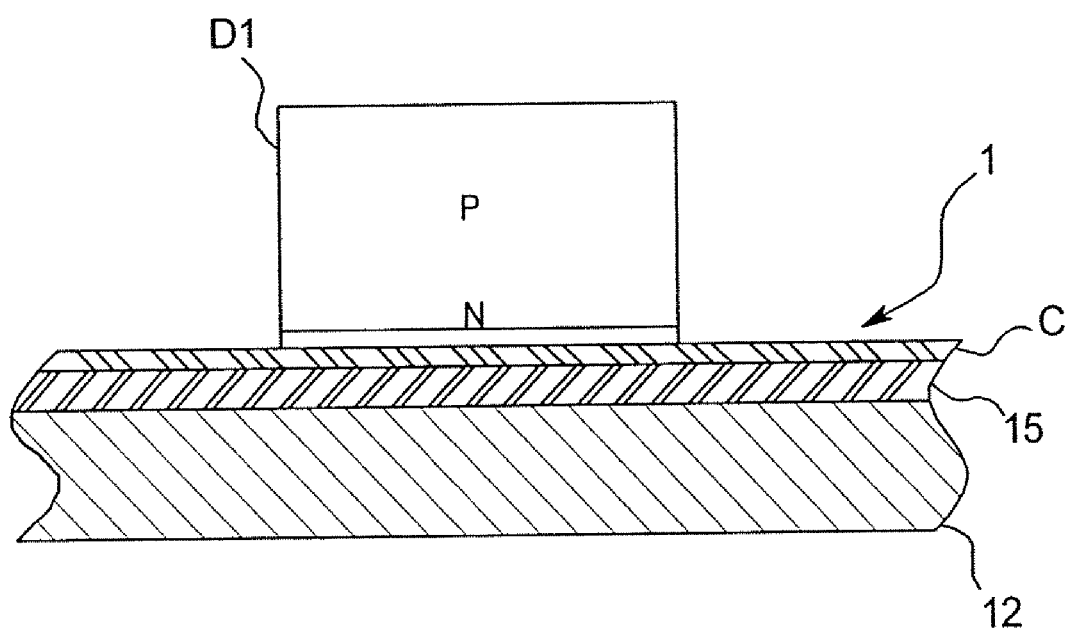
FIG. 10 is a magnified longitudinal sectional view showing a portion where a bear element is mounted in accordance with a conventional arrangement.

Furthermore, the silver plate coating M is applied to the surface of the heat conducting member 14, however, a material whose reflection coefficient is large and that reflects light of wavelength other than the visible light region such as the near-infrared light or ultraviolet light may be coated. In addition, the silver plate coating M may be coated on the surface of the heat conducting member 14 placed on the heat dissipating member 12 as shown in FIG. 5, or may be coated on the surface of the heat dissipating member 12 as shown in FIG. 6.

The silver plate coating M is formed by the ion plating method, however, it is not limited to this and other coating method or plating method may be applied as far as a formed coated layer is superior in terms of corrosion resistance.

In addition, the heat conductive member 14 is mounted between the heat dissipating member 12 and the wiring board 11, however, the heat conductive member 14 may be made to be smaller in area than the bear element exposing bore 111 of the wiring board 11 and arranged in the bear element exposing bore 111.

Furthermore, the parallel light may be light traveling at an angle within ±5% to the radiation axis P since the light produces the same effect as that of the above-mentioned embodiment.

Next, a further different embodiment will be described with reference to FIG. 7 through FIG. 10 with focusing attention on a method for manufacturing the light emitting diode unit in accordance with the present claimed invention The light emitting diode unit D in accordance with this embodiment has the same arrangement as that of the light emitting diode unit in accordance with the former embodiment except for the base 1 and the bear element D1 as the light emitting element. The same code is given to the component corresponding to the component of the former embodiment.

The bear element D1 is in a shape of a rectangle block of a surface-mounted type with its bottom surface being cathode and a top surface being anode wherein an extremely thin (several dozen μm) N-type semiconductor is arranged in a laminated state on a bottom surface of a P-type semiconductor.

The bear element D1 is referred to, so called, a power LED that can pass a current of not less than 250 mA and consumes a considerable amount of electric power and produces a considerable amount of release of heat energy compared with a regular LED. Since the heat is generated from mainly a boundary B between the P-layer and the N-layer, the boundary B is arranged close to the bottom surface, namely, a connecting surface D1a that faces the base 1 in order to dissipate the heat effectively.

The base 1 is platy and in a shape of a general circle in a plane view, and mainly consists of the heat dissipating member 12 made of aluminum, wherein a laminated insulating material 15 covers a top surface of the heat dissipating member 12, and the wiring pattern C is arranged on the insulating material 15. The insulating material 15 is made of, for example, polyimide resin or epoxy resin and in an extremely thin layer of several dozen μm in order not to disturb heat conduction. The wiring pattern C is also thin wherein gold plate is applied to copper, and in this embodiment a pair of positive and negative wiring patterns C(1), C(2) are provided.

In this embodiment, one of the wiring pattern C(1) is made to extend to almost entire area of the surface including a center portion of the base 1 and the bear element D1 is mounted on the wiring pattern C(1) via a spacer SP of a solid rectangle block.

The spacer SP is electrically conductive and made of a material, for example, copper whose area in a plane view is larger than that of the bear element D1, and connected on the wiring pattern C(1) by soldering with, for example, Sn—Pb of solder as a second jointing material. A thickness of the spacer SP is set so as to be bigger than a height of the solder protruding around a boundary between the wiring pattern C and the spacer SP. The bottom surface D1a of the bear element D1 is bonded on the spacer SP using an alloy of gold and tin.

A procedure to mount the bear element D1 on the base 1 will be explained. First, the bottom surface D1a of the bear element D1 is bonded on the spacer SP using the alloy of gold and tin. After making a thus combined integrated member of the spacer SP and the bear element D1, the combined integrated member is bonded on the wiring pattern C(1) of the base 1. More concretely, cream solder is applied to the wiring pattern C(1) of the base 1, the combined integrated member of the spacer SP and the bear element D1 is placed on the cream solder, and then the bottom surface D1a of the bear element D1 is fixed to the wiring pattern C(1) in an electrically connected state by providing a reflowing processing. Next, a top surface of the bear element D1, namely anode is bonded with the other wiring pattern C(2) by a wire.

In accordance with the arrangement, since the bear element D1 and the spacer SP are connected by the alloy of gold and tin whose protruding portion is low, the P-layer and the N-layer of the bear element D1 will not be connected by the protruding portion of the alloy of gold and tin, thereby enabling avoidance of being short-circuited. In addition, since the spacer SP and the base 1 are connected using the Sn—Pb solder, whose melting temperature is lower than a heat-resistant temperature of the insulating material 15, after the bear element D1 and the spacer SP are connected, there is no chance of destroying the insulating material 15.

Furthermore, since the spacer SP is made of copper whose heat conduction is superior and the wiring pattern C(1) is also made to be large enough not to disturb heat conduction, heat generated by the bear element D1 due to light emission can be quickly transmitted to the heat dissipating member 12, thereby enabling to reduce a possibility of damaging the bear element D1 due to the heat.

In addition, if a necessity arises to bend the base 1, the force causing the base 1 to bend will not be directly transmitted to the bare element D1, preventing the possibility of damage to the bare element D1 or its becoming detached due to such force and movement.

Furthermore, since the bear element D1 protrudes from the base 1 by a height of the spacer SP, an optical system can be mounted with ease, which, through reflection, can facilitates the effective utilization of light irradiated exactly radially from the bear element D1.

In addition, a predetermined degree of smoothness is required only for a top surface of the spacer SP that is connected with the bear element D1, thereby simplifying the manufacturing process.

A temperature of the bear element D1, the base 1 and the spacer SP all fluctuates when bonding is carried out or during light emission, and each of the parts expands or contracts individually, as the temperature varies. However, since a thermal expansion coefficient of the spacer SP falls between a thermal expansion coefficient of the bear element D1 and a thermal expansion coefficient of the heat dissipating member 12, a thermal stress resulting from difference of cubical expansion can be suppressed. In this embodiment, the spacer SP is made of copper, whose thermal expansion coefficient is about $16 \times 10^{-6}/K$, the heat dissipating member 12 is made of aluminum, whose thermal expansion coefficient is about $23.7 \times 10^{-6}/K$, and the bear element D1 is made of silicon carbide, whose thermal expansion coefficient is about $4.2 \times 10^{-6}/K$.

In addition, since the spacer SP is made of copper that is superior in thermal conductivity the heat generated from the bear element D1 will be quickly transmitted to the base 1 and a temperature difference between the bear element D1, the spacer SP and the base 1 can be equalized in a short period of time, and a thermal stress resulting from temperature differences between the bear element D1, the spacer SP and the base 1 can also be suppressed.

Furthermore, since the spacer SP is mounted on the base 1 after the bear element D1 is mounted on the spacer SP, a difficult process of mounting the bear element D1 on the spacer SP can be carried out with common equipment even though base 1 differs. As a result, the equipment can be commonized and it is possible to avoid a situation where the entire base 1 has to be discarded because a defective bear element D1 or a bear element D1 due to a defective bear element D1 whose bonding or wiring to the spacer SP failed, because such defective parts can be discarded at a time the bare element D1 is mounted on the spacer SP is failed.

In addition, if ever a spacer SP is improperly connected to the base 1 (positional inaccuracy), the spacer SP can be simply dismounted and remounted appropriately because it is connected by soldering.

Furthermore, since it is possible to mount the bear element D1 on the base 1 without touching the bear element D1, because the spacer SP itself is grasped and mounted, a problem of the bear element D1 being broken when mounted on the base 1 can be avoided, thereby improving quality.

The spacer is not limited to an electrically conductive material such as copper. For example, aluminum nitride can be represented as an insulating material. A thermal expansion coefficient of the aluminum nitride has a value between the thermal expansion coefficient of the silicon bear element and the thermal expansion coefficient of the heat dissipating member, and the value is closer to the thermal expansion coefficient of the bear element than the thermal expansion coefficient of the heat dissipating member. As a result, a thermal stress is difficult to be generated between the spacer of the aluminum nitride and the bear element although the aluminum nitride is inferior a little to the copper in terms of the thermal conductivity, thereby enabling to effectively protect the bear element. In case of the aluminum nitride, two wires are required. In addition, it is further preferable that each surface facing the base and the light emitting element be metalized in terms of connection.

As mentioned above, in accordance with this embodiment, newly developed problems deriving from a mounting process or heat dissipation due to appearance of power LEDs can be effectively solved.

Next, another embodiment of the refracting element will be explained with reference to FIG. 11 and FIG. 12.

The refracting element is a Fresnel lens F comprising a convex lens portion F1 arranged at the lens center and multiple orbicular zone lens portions F2 arranged around the convex lens portion F1 concentrically, and especially in this embodiment it is so set that a distance between a predetermined position (for example, a center position) of its refracting surface F21 and the bear element D1 along a direction of the optical axis P increases with distance closer to the center. More concretely, the center position of each refracting surface F21 is set to be located on a predetermined arc in a cross-sectional view and intensity of light H parallelized by refraction due to the Fresnel lens F is uniformed as much as possible.

Figure 13:
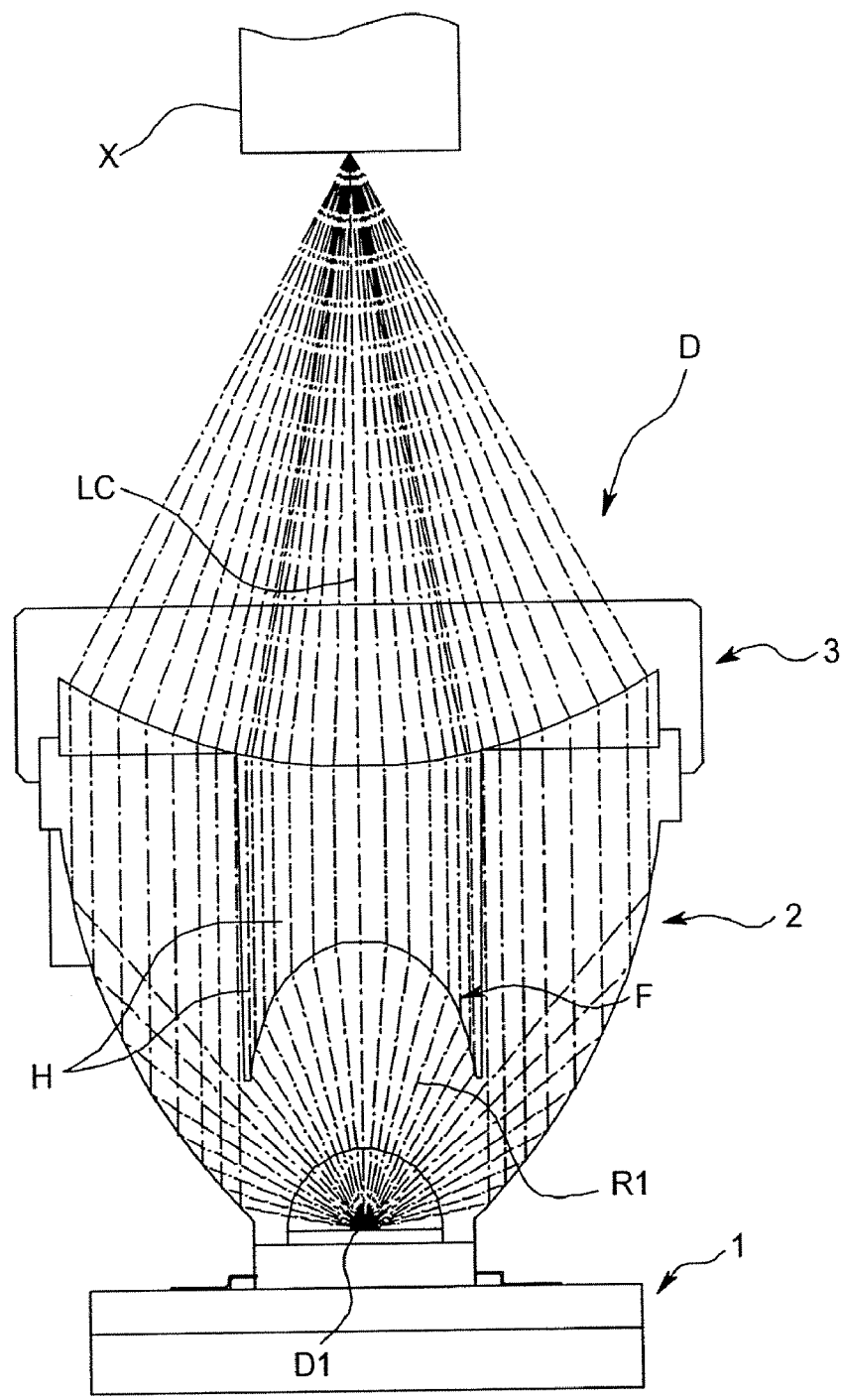
FIG. 13 is a longitudinal sectional view of the principal portion of the first lens showing an example wherein a refracting element of the present claimed invention comprises an aspheric lens.

In other words, if light R1 emitted from the bear element D1 is attempted to be parallelized by an ordinary spherical refracting lens or an aspherical refracting lens F, the light intensity increases away from the center of the beam, as shown in FIG. 13. Furthermore, in case where the light is converged again in order to introduce the parallel light H into an object X, for example to introduce the light into an optical fiber or a red lens, the angle between the outside portion of the light and the center of the optical axis increases with distance away from the center, which prevents the efficient introduction of light into the object X of the efficient transmission of the light inside the object X. As a result, as shown in FIG. 13, the parallel light H whose light density is higher at a position closer to the outside is not preferable in view of an efficiency of introducing the light into the object X.

Figure 11:
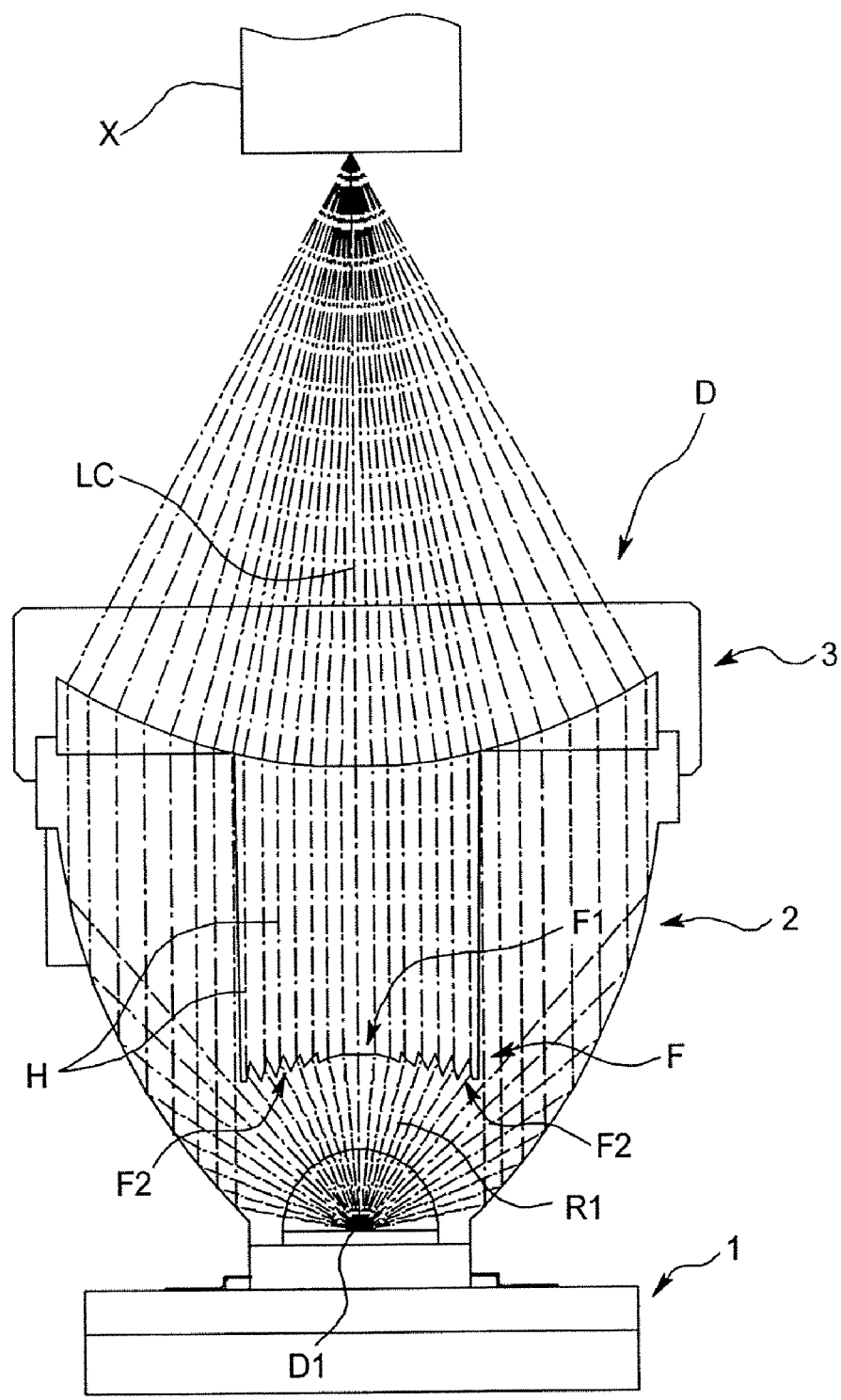
FIG. 11 is a general structure cross-sectional view of a light emitting diode unit in accordance with a further different embodiment of the present claimed invention.

However, in accordance with this embodiment, as shown in FIG. 11, since the intensity of the parallel light H is alleviated from deviating toward outside and can be uniformed, it is possible to introduce the light effectively into the object X compared with an ordinary spherical refracting lens.

The refracting surface F21 of each orbicular zone lens portion F2 is made aspheric.

Figure 12:
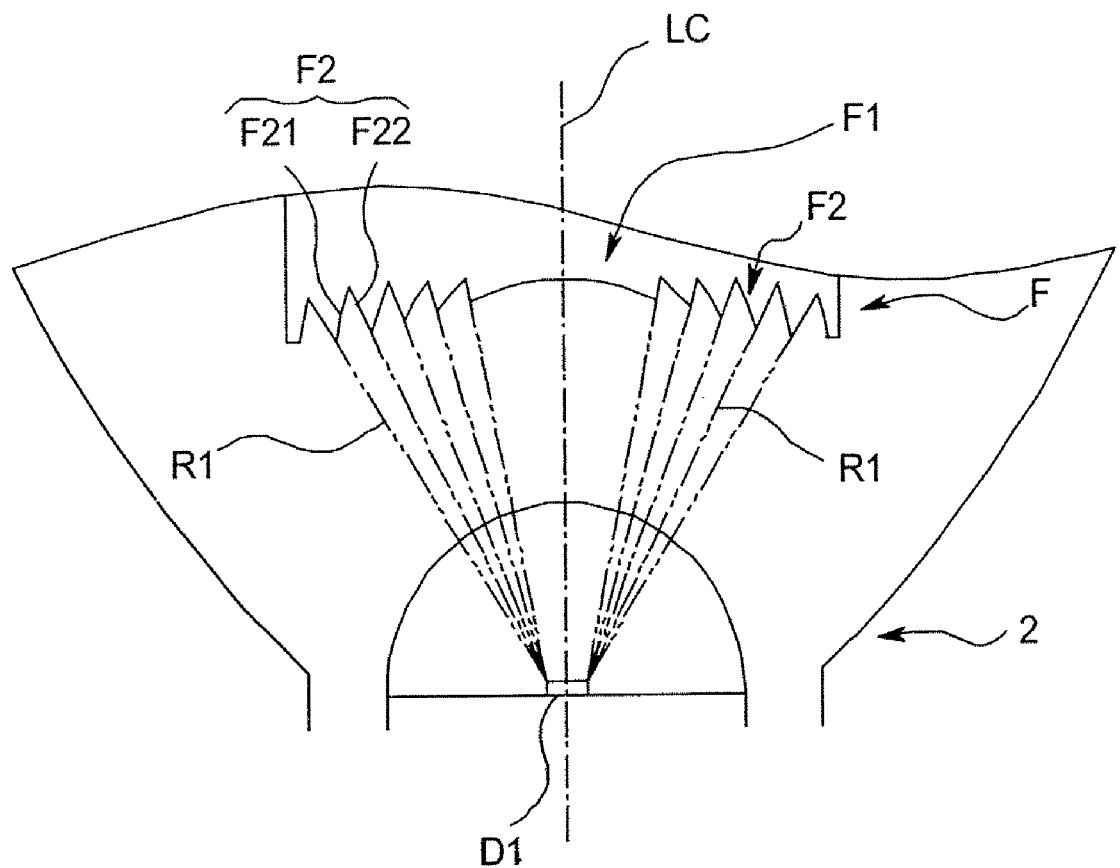
FIG. 12 is a longitudinal sectional view of a principal portion of the first lens in accordance with the embodiment.

Furthermore, in this embodiment, as shown in FIG. 12, an angle, between a connecting surface F22 between the refracting surface F21 of one orbicular zone lens portion F2 and a refracting surface F21 of the orbicular zone lens portion F2 of its outer radial neighbor and the optical axis LC, is set to be identical with or smaller than the angle between the light R1 traveling from an end of the bear element D1 toward a bottom end of the connecting surface F22 and the optical axis LC.

As a result of this, it is possible to introduce all of the light emitted from the bear element D1 that actually has a measurable light emitting area into the refracting surface F21 of the orbicular zone lens portion F2 and to refract it forward without appreciable loss and effectively.

Other arrangement may be variously modified without departing from the spirit of the invention.

POSSIBLE APPLICATIONS IN INDUSTRY

As mentioned above, in accordance with the present claimed invention, since the light emitted from the light emitting element, the point light source, can be converged as the parallel light traveling toward the same direction without appreciable loss and the parallel light can be converged upon a small area with ease, if, for example, the aspherical lens is used, it is possible to provide the high performance light emitting diode unit that is extremely superior in terms of light converging performance and that can irradiate the light with high intensity upon the point of convergence. The light emitting diode unit has big possible applications especially in a field of lighting such as a surface inspection, an image processing or medical applications.

The invention claimed is:

1. A light emitting diode unit comprising:
a light emitting element of a super high luminance type that can pass an electric current of not less than 250 mA;
a heat dissipating member that dissipates heat generated from the light emitting element;
an insulating material that covers the heat dissipating member;
a wiring pattern arranged on the insulating material; and
a heat conductive spacer, whose coefficient of heat conductivity is larger than that of the heat dissipating member arranged between the light emitting element and the wiring pattern, wherein the light emitting element is arranged with a boundary between a P-layer and an N-layer of the light emitting element extremely close to a connecting surface to the wiring pattern.

2. The light emitting diode unit described in claim 1, wherein the insulating material is laminated.

3. The light emitting diode unit described in claim 1, and characterized by the spacer is electrically conductive.

4. The light emitting diode unit described in claim 1, and characterized by that a thermal expansion coefficient of the spacer has a value between a thermal expansion coefficient of the light emitting element and a thermal expansion coefficient of the heat dissipating member.

5. The light emitting diode unit described in claim 1, and characterized by that the thermal expansion coefficient of the spacer has a value between the thermal expansion coefficient of the light emitting element and the thermal expansion coefficient of the heat dissipating member, wherein the value is closer to the thermal expansion coefficient of the light emitting element than the thermal expansion coefficient of the heat dissipating member.

6. The light emitting diode unit described in claim 1 further including a lens unit, positioned to direct light from the light emitting element, comprising a reflecting element that reflects light traveling outside of a predetermined angle among the light emitted by the light emitting element and a refracting element that refracts light traveling inside of the predetermined angle among the light emitted by the light emitting element, each of which is integrally formed, with the first lens mounted integrally on the base, wherein the emitted light from the light emitting element is made to travel generally toward the same direction by the reflecting element and the refracting element.

7. The light emitting diode unit described in claim 6 wherein the refracting element is a Fresnel lens comprising a convex lens portion arranged at the Fresnel lens center and multiple orbicular zone lens portions arranged concentrically around the convex lens portion.

8. The light emitting diode unit described in claim 7, and characterized in that a distance between each orbicular zone lens portion and the plane of the light emitting element, parallel to the optical axis, is set to increase for the orbicular zone lens portions located closer to the center.

9. A light emitting diode unit comprising:
a light emitting element that can pass an electric current of not less than 250 mA;
a heat dissipating member that dissipates heat generated from the light emitting element;
an insulating material that covers the heat dissipating member;
a wiring pattern arranged on the insulating material; and
a heat conductive spacer, whose coefficient of heat conductivity is larger than that of the heat dissipating member arranged between the light emitting element and the wiring pattern, wherein the light emitting element is arranged with a boundary between a P-layer and an N-layer of the light emitting element adjacent to a connecting surface to the wiring pattern.

10. The light emitting diode unit described in claim 9, wherein the insulating material is laminated.

11. The light emitting diode unit described in claim 9, and characterized by the spacer is electrically conductive.

12. The light emitting diode unit described in claim 9, and characterized by that the thermal expansion coefficient of the spacer has a value between the thermal expansion coefficient of the light emitting element and the thermal expansion coefficient of the heat dissipating member, wherein the value is closer to the thermal expansion coefficient of the light emitting element than the thermal expansion coefficient of the heat dissipating member.

13. The light emitting diode unit described in claim 9 further including a lens unit, positioned to direct light from the light emitting element, comprising a reflecting element that reflects light traveling outside of a predetermined angle among the light emitted by the light emitting element and a refracting element that refracts light traveling inside of the predetermined angle among the light emitted by the light emitting element, each of which is integrally formed, with the first lens mounted integrally on the base, wherein the emitted light from the light emitting element is made to travel generally toward the same direction by the reflecting element and the refracting element.

14. The light emitting diode unit described in claim 13 wherein the refracting element is a Fresnel lens comprising a convex lens portion arranged at the Fresnel lens center and multiple orbicular zone lens portions arranged concentrically around the convex lens portion.

15. The light emitting diode unit described in claim 14, and characterized in that a distance between each orbicular zone lens portion and the plane of the light emitting element, parallel to the optical axis, is set to increase for the orbicular zone lens portions located closer to the center.

16. A light emitting diode unit comprising:
a super high luminance light emitting element;
a base including a heat dissipating member that dissipates heat generated by the light emitting element;
a laminated insulating material covering over the heat dissipating member; and
a wiring pattern arranged on the insulating material, wherein a boundary between the P-layer and an N-layer of the light emitting element is adjacent the wiring pattern, and light emitting element is mounted on and connected to the wiring pattern via a spacer whose coefficient of heat conductivity is larger than that of the heat dissipating member, the spacer is arranged between the heat dissipating member and the light emitting element.

17. The light emitting diode unit described in claim 16, and characterized in that the spacer is electrically conductive.

18. The light emitting diode unit described in claim 17, and characterized in that a thermal expansion coefficient of the spacer has a value between a thermal expansion coefficient of the light emitting element and a thermal expansion coefficient of the heat dissipating member.

19. The light emitting diode unit of claim 16, further including a first lens comprising a reflecting element that reflects light traveling outside of a predetermined angle among the light emitted by the light emitting element and a refracting element that refracts light traveling inside of the predetermined angle among the light emitted by the light emitting element, each of which is integrally formed, with the first lens mounted integrally on the base, wherein the emitted light from the light emitting element is made to travel generally toward the same direction by the reflecting element and the refracting element.

* * * * *